United States Patent [19]
Katoh

[11] Patent Number: 5,986,346
[45] Date of Patent: Nov. 16, 1999

[54] SEMICONDUCTOR DEVICE WITH IMPROVED PAD CONNECTION

[75] Inventor: Takahiro Katoh, Kasugai, Japan

[73] Assignee: Fujitsu Limited, Kasawaki, Japan

[21] Appl. No.: 09/273,472

[22] Filed: Mar. 22, 1999

[30] Foreign Application Priority Data

Aug. 6, 1998 [JP] Japan ................................. 10-223342

[51] Int. Cl.⁶ .......................... H01L 23/48; H01L 23/52; H01L 29/40
[52] U.S. Cl. .......................... 257/773; 257/786; 257/781; 257/698
[58] Field of Search .................................... 257/698, 780, 257/781, 773, 774, 786

[56] References Cited

U.S. PATENT DOCUMENTS

| 5,248,903 | 9/1993 | Heim . |
| 5,367,195 | 11/1994 | DiGiacomo et al. . |
| 5,442,239 | 8/1995 | DiGiacomo . |
| 5,502,337 | 3/1996 | Nozaki et al. . |
| 5,736,791 | 4/1998 | Fujiki et al. . |

Primary Examiner—Sheila V. Clark
Attorney, Agent, or Firm—Armstrong, Westerman, Hattori, McLeland & Naughton

[57] ABSTRACT

A semiconductor device includes a semiconductor chip and a wiring formed on the chip. An interlayer film is located on the wiring. A pad is located on the interlayer film and is connected to the wiring with contacts that extend from the wiring, through the interlayer film, to the pad. The contacts include a first group of contacts located near the perimeter of the pad and a second group of pads located near the center of the pad. By limiting the number and placement of the contacts, the pad allows for a secure connection between the pad and the wiring and between the pad and a bonding wire.

16 Claims, 6 Drawing Sheets

SEMICONDUCTOR DEVICE WITH IMPROVED PAD CONNECTION

BACKGROUND OF THE INVENTION

The invention relates to a semiconductor device, and more particularly, to a connection structure for input/output pads of the semiconductor device.

Generally in a packaged LSI, a chip and a package are interconnected by bonding wires. The chip is centrally formed and includes an internal logic circuit. The upper surface of the chip is formed with a plurality of I/O pads around its outer periphery. These pads are used to feed power to and for input/output of signals to and from the internal logic circuit. The pads are interconnected with lead electrodes which are exposed outside the package by means of bonding wires.

A first example of a conventional connection structure for an I/O pad 11 will be described with reference to FIGS. 1(a) and 1(b). FIG. 1(a) is a top plan view of the pad 11, and FIG. 1(b) is a cross-sectional view taken along line 1b—1b of FIG. 1(a).

An interlayer film 12, such as an oxide film, is disposed below the pad 11 which is substantially square in configuration. A wiring 13 is disposed below the pad 11. The pad 11 and the wiring 13 are interconnected via a plurality of contacts 14 that are aligned along each side of the pad 11. An automatic wire bonder, not shown, bonds a bonding wire 15 to a central region of the pad 11.

The pad 11 has a plurality of depressions 16 of a very small depth in its upper surface at locations which correspond to the contacts 14. The depressions 16 are formed when the pad 11 is formed. Because the depressions 16 are located around the outer edges of the pad 11, the upper surface of the pad 11 exhibits a high level of flatness which insures that there is an extensive area for bonding between the pad 11 and the wire 15, thus allowing a reliable connection between the pad 11 and the wire 15.

The pad 11 is interconnected with the wiring 13 via the contacts 14 which are disposed along the outer edges of the pad 11. This means that the number of interconnections between the pad 11 and the wiring 13 is small, leading to a low connection strength of the pad 11. In order to provide a higher level of integration, integrated circuits use multiple wiring layers and the contacts 14 are made much thinner than before. This further contributes to reducing the connection strength of the pad 11.

Reduced connection strength of the pad 11 presents a problem in the bonding process. When the bonder affixes the wire 15 to the pad 11, an upward force is applied to the pad 11 by the wire 15 which may separate the pad 11 from the interlayer film 12 or the interlayer film 12 from the wiring 13. Because no connection via the contacts 14 is made to the wiring 13 from the central region of the pad 11, the central region of the pad 11 is particularly susceptible to separation.

A second example of a conventional pad connection structure which is designed to exhibit an increased strength against the upward force caused by the wire 15 will be described with reference to FIGS. 2(a) and 2(b). A pad 11a is interconnected with a wiring 13 via contacts 14 which are located at equal intervals over the entire surface of the pad 11a. The number of interconnections between the pad 11a and the wiring 13 or the contacts 14 is increased, and hence the pad 11a is firmly secured to the wiring 13 (and also to the interlayer film 12). Separation of the pad 11a from either the interlayer film 12 or the wiring 13 is prevented, although an upward force is still applied to the pad 11 during the bonding operation.

However, because a number of depressions 16, which corresponds to the number of contacts 14, are formed in the upper surface of the pad 11, the surface flatness of the pad 11a is reduced, which reduces an area on the upper surface of the pad 11a for bonding with wire 15. Accordingly, the wire 15 is susceptible to separation from the pad 11a, resulting in a degradation in the reliability of the integrated circuit.

It is an object of the invention to provide a semiconductor device with an increased pad connection strength.

SUMMARY OF THE INVENTION

To achieve the above objective, the present invention provide a semiconductor device comprising: a semiconductor chip; a wiring formed on the semiconductor chip; an interlayer film disposed on top of the wiring; a pad disposed on top of the interlayer film and including an outer edge and a central region; and a plurality of contacts formed within the interlayer film to interconnect the pad with the wiring, the plurality of contacts including first and second contact groups which are disposed in an offset manner so as to be locally concentrated along the outer edge and in the central region, respectively, of the pad.

The present invention further provides a semiconductor device comprising: a semiconductor chip; a wiring formed on the semiconductor chip; an interlayer film disposed on top of the wiring; a pad disposed on top of the interlayer film and including an outer edge and a central region; and first and second contacts formed within the interlayer film for interconnecting the wiring with the pad, the first contact being disposed along the outer edge of the pad and the second contact being disposed in the central region of the pad.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Referring to FIGS. 3 and 4, a packaged LSI according to one embodiment of the invention will be described.

Figure 3B:
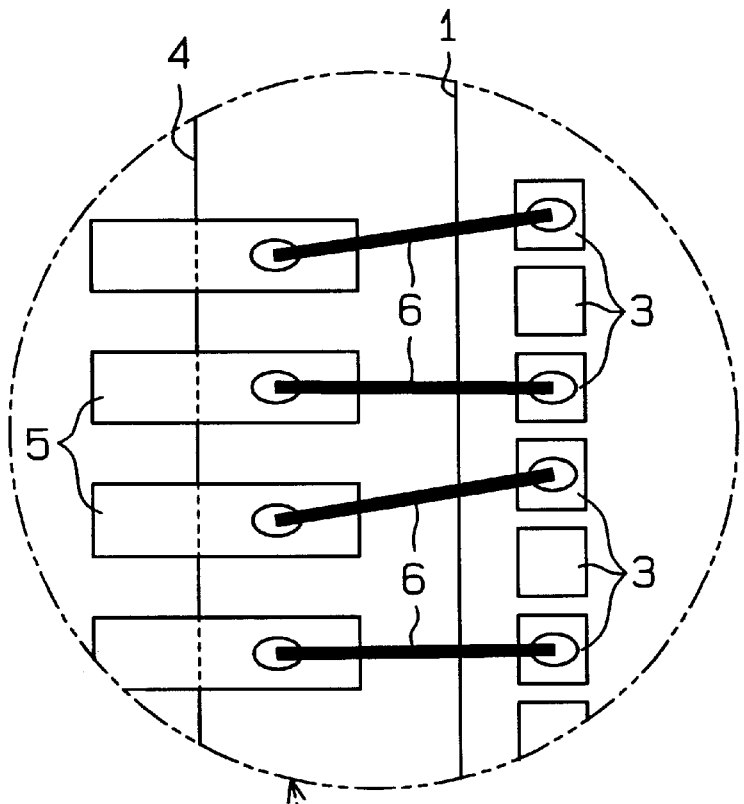
FIG. 3(b) is an enlarged view of a part of FIG. 3(a)
Figure 3A:
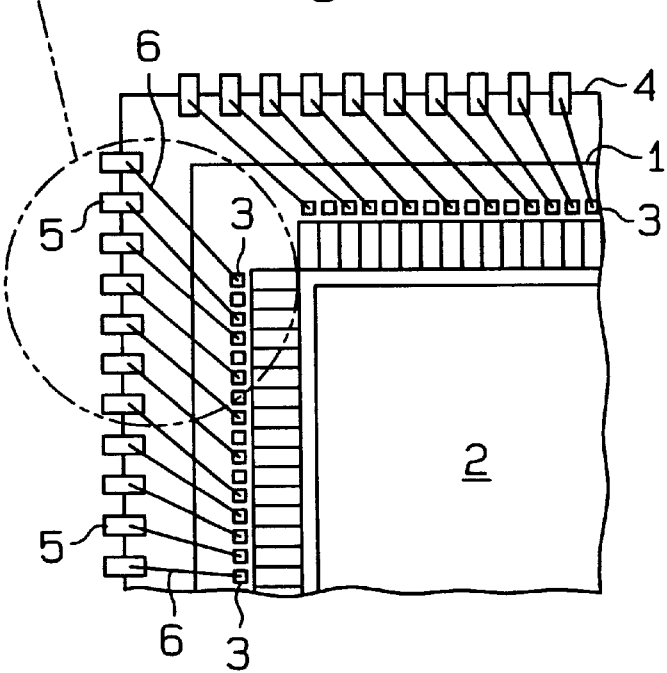
FIG. 3(a) is a top plan view of a part of an LSI according to a first embodiment of the present invention.

As shown in FIGS. 3(a) and 3(b), the packaged LSI comprises a chip 1 having a multilayer wiring structure and a package 4 connected to the chip 1. The chip 1 has a centrally located internal logic circuit 2 formed by a plurality of elements. A plurality of I/O pads 3 are formed around the outer periphery of the chip 1, and are used to feed power to and for input/output of signals to and from the internal logic circuit 2. Lead electrodes 5 are formed on the package 4 and are externally exposed. The pads 3 are connected to the lead electrodes 5 on the package 4 by bonding wires 6.

Figure 4A:
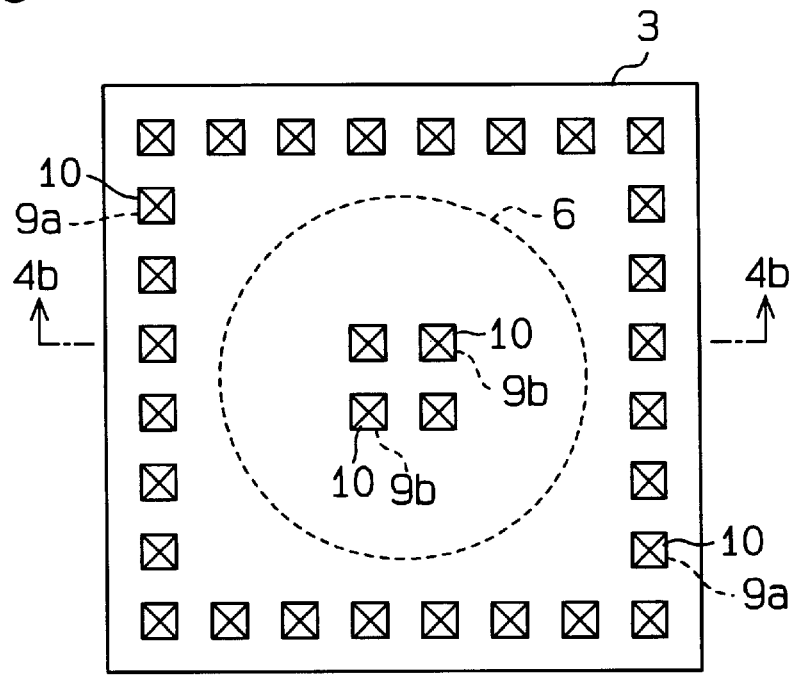
FIG. 4(a) is a top plan view of a pad of the LSI shown of FIG. 3(a)
Figure 4B:
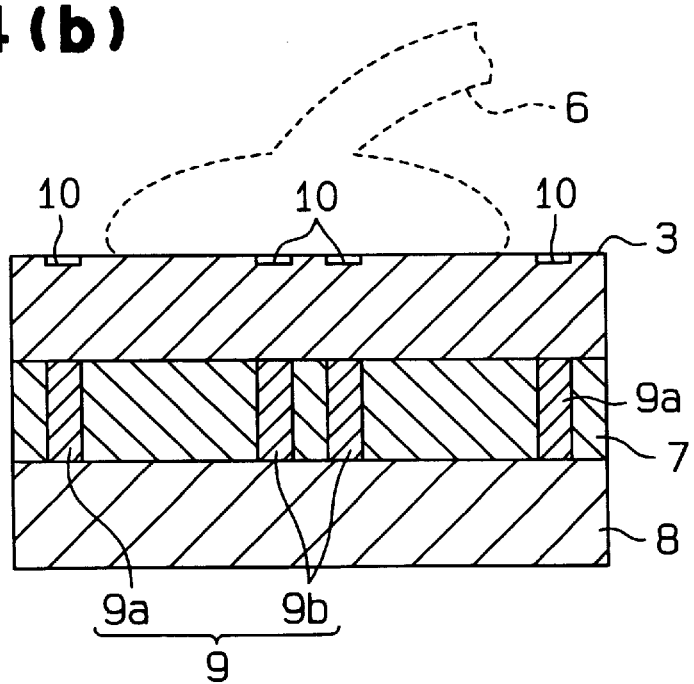
FIG. 4(b) is a cross-sectional view taken along line 4b—4b of FIG. 4(a)

As shown in FIGS. 4(a) and 4(b), the pad 3 are substantially square. An interlayer film 7, which preferably comprises an oxide film, is disposed below the pad 3. A wiring 8 is located below the interlayer film 7. A plurality of contacts 9 in the interlayer film 7 provides an interconnection between the pad 3 and the wiring 8. It is to be noted that the pad 3 may be rectangular or in any desired configuration. The pad 3 is formed with depressions 10 of a very small depth in its upper surface at locations corresponding to the contacts 9. The bonding wire 6 is bonded to a central region of the pad 3 as shown in FIGS. 4(a) and 4(b).

As will be noted, the contacts 9 are disposed in an offset manner so as to be locally concentrated in the central region of the pad 3 and also along the outer edges of the pad 3. Specifically, there are contacts 9a aligned with each side of the pad 3 and a given number of contacts 9b (four in FIG. 4(b)) which are locally disposed in the central region of the pad 3. Preferably, the contacts 9a are disposed at least near the four corners of the pad 3 and the contacts 9b are disposed within a region designated for bonding with the wire 6.

The number of contacts 9b is chosen to be in a range which assures a desired connection strength between the pad 3 and the wiring 8 (or pad-wiring connection strength) and maintaining a desired bonding strength between the pad 3 and the wire 6 (or pad-wire bonding strength). It will be appreciated that both the pad-wiring connection strength and the pad-wire bonding strength depend on the number of contacts 9b provided. Specifically, the lower the number of contacts 9b, the lower the pad-wiring connection strength and the greater the pad-wire bonding strength. Conversely, the more the number of contacts 9b, the higher the pad-wiring connection strength and the less the pad-wiring bonding strength. Accordingly, the number of contacts 9b is chosen to be in a range commensurate with maintaining the connection between the pad 3 and the wire 6 intact even during the bonding operation. The number of contacts 9b may be changed as desired within such a range. The number of contacts 9b may be set in accordance with the area designated for bonding between the pad 3 and the wire 6. In addition, the layout of the contacts 9b may be changed as desired.

It is to be noted that the pad 3 is illustrated in FIG. 4(a) is exemplary and that the actual number of contacts 9a and 9b may be different from the illustration of FIG. 4(a). In actuality, there are more contacts 9a, 9b than shown in FIG. 4. Actual sizes of the pad 3 and the contacts 9a and 9b are preferably chosen such that when a pad measures 80 $\mu$m on a side, each of the contacts 9a and 9b measures about 0.6 $\mu$m on a side and a spacing between adjacent contacts 9a or 9b about is 1.2 $\mu$m.

Figure 1:
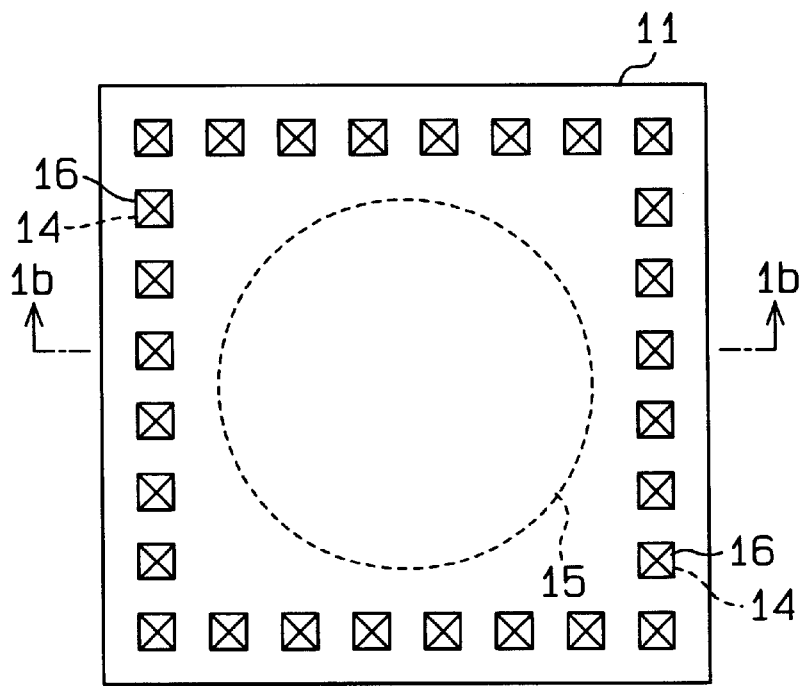
FIG. 1(a) is a top plan view of a first example of a conventional pad.
FIG. 1(b) is a cross-sectional view taken along line 1b—1b of FIG. 1(a)
Figure 1:
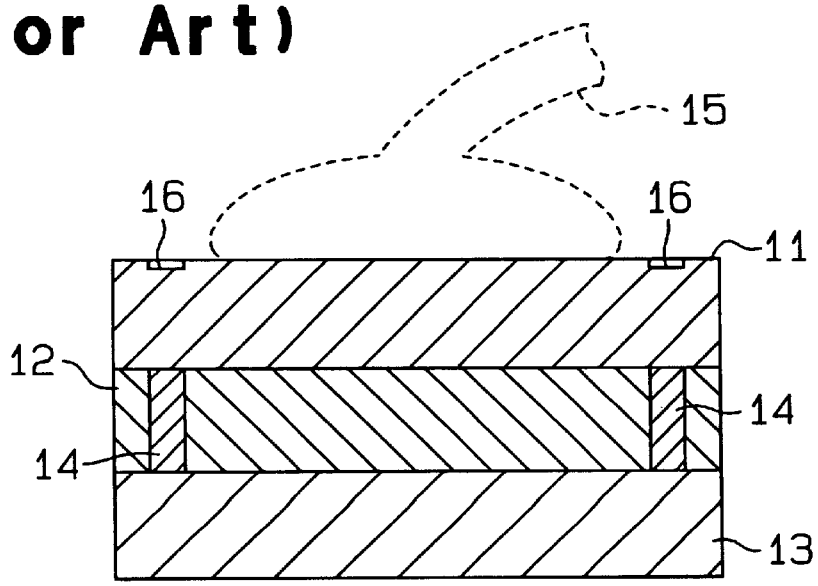

In this manner, the pad 3 is firmly secured to the wiring 8 or the interlayer film 7 by means of the contacts 9a and 9b. The pad-wiring connection strength is improved over that of the prior art illustrated in FIG. 1, and maintains the pad 3 connected to the wiring 8 even if an upward force is applied to the pad 3.

Figure 2A:
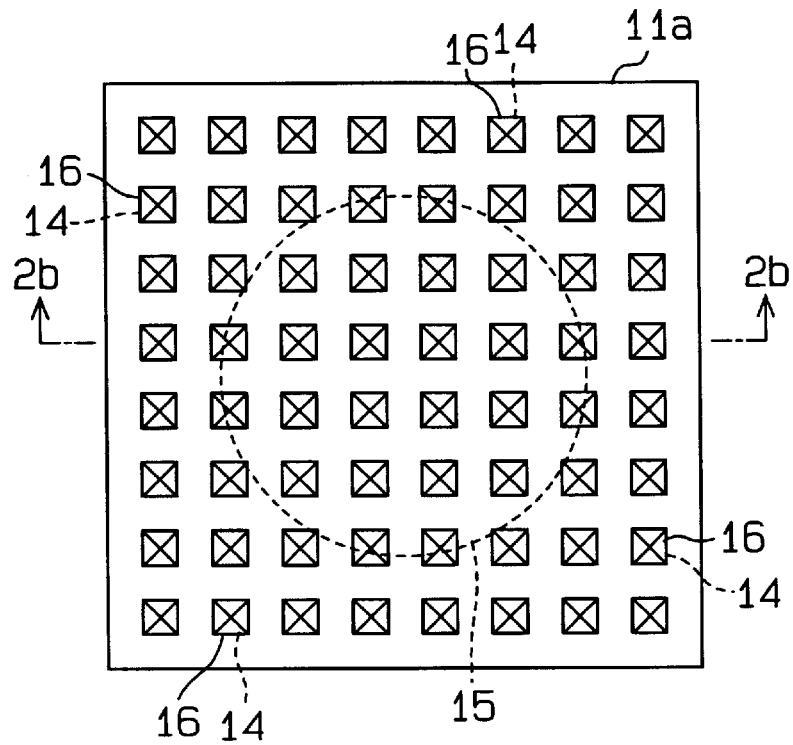
FIG. 2(a) is a top plan view of a second example of a conventional pad.
Figure 2B:
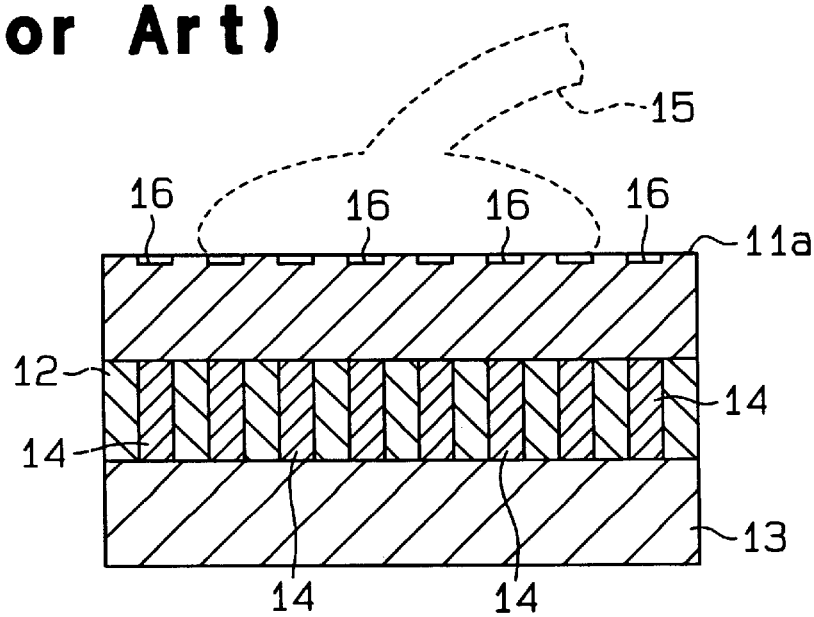
FIG. 2(b) is a cross-sectional view taken along line 2b—2b of FIG. 2(a)

A reliable bond between the pad 3 and the wire 6 is maintained inasmuch as the number of contacts 9b disposed in the central region is reduced in comparison to the prior art illustrated in FIG. 2 to allow the pad 3 to retain a high level of flatness so that there is a broader area for bonding between the pad 3 and the wire 6, thus avoiding a poor bonding of the wire 6.

It should be apparent to those skilled in the art that the present invention may be embodied in many other specific forms without departing from the spirit or scope of the invention. Particularly, it should be understood that the invention may be embodied in the following forms:

As long as the contacts 9a and 9b are disposed in an offset manner to be locally concentrated along the outer edges and in the central region of the pad 3, the number and the disposition of the contacts 9a and 9b may be modified as desired. It is preferred in particular that the contacts 9a are disposed at at least the four corners of the pad 3 while the contacts 9b are locally disposed in the central region of the pad 3.

Figure 5A:
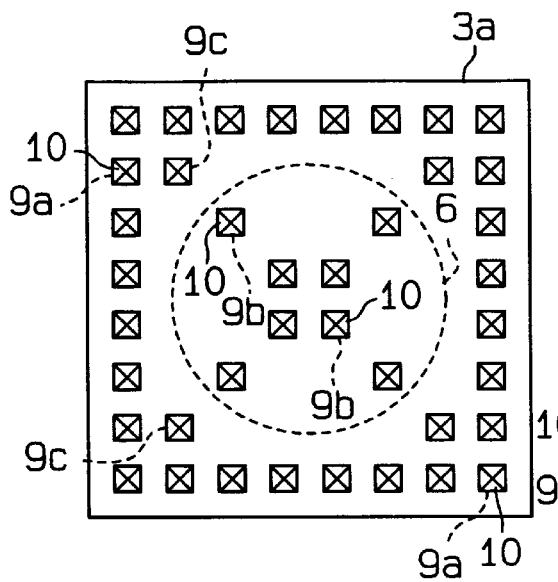
FIGS. 5(a) to 5(d) are top plan views of other pads in accordance with the present invention.

By way of an example, the contacts 9a may be disposed along each side of a pad 3a as an outer array and additional contacts 9c may be disposed inside the outer array at the four corners of the pad 3, as shown in FIG. 5(a). Contacts 9b are locally disposed in the central region of the pad 3a, and may include a central group of contacts 9a together with contacts 9b which are spaced from the central group and radially extend from the center of the pad 3a. Alternatively, the contacts 9a and 9b may be disposed at an equal spacing between adjacent contacts along the diagonals of the pad 3a.

Figure 5B:
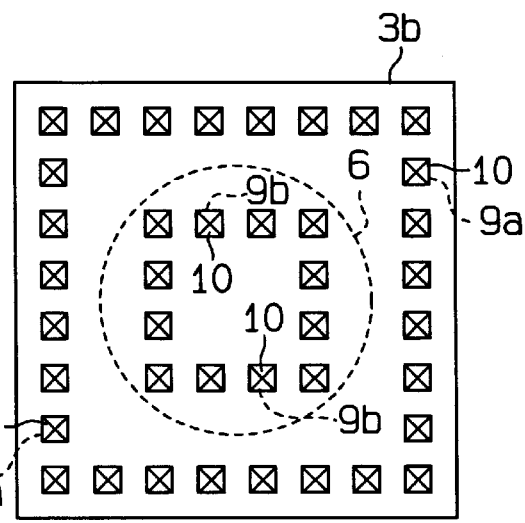
Figure 5C:
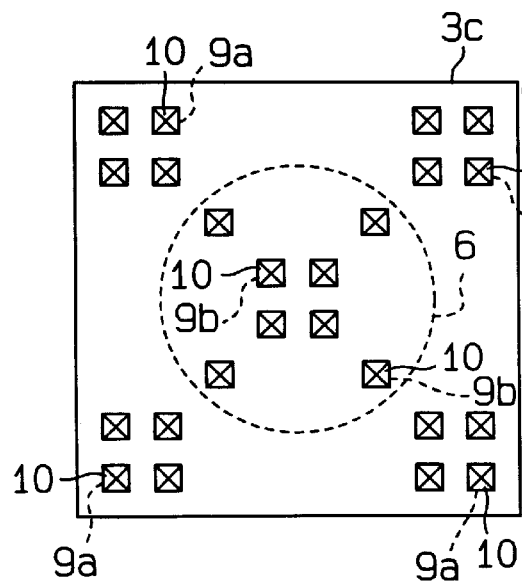
Figure 5D:
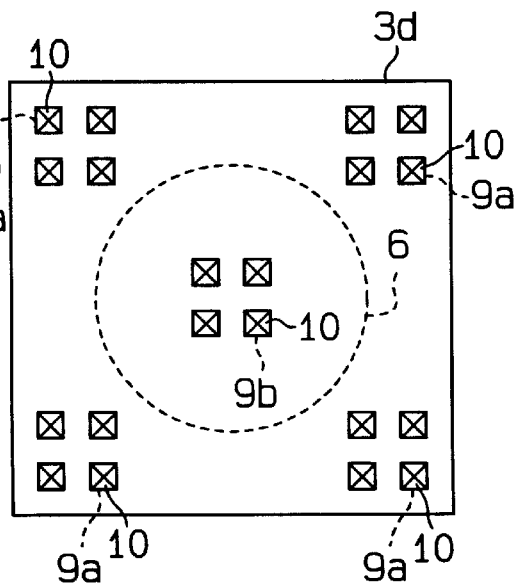

Furthermore, the contacts 9b may be disposed within the region designated for bonding with the wire 6, but in a manner to avoid their disposition at the center of a pad 3b, as shown in FIG. 5b. In FIG. 5(c), a group of contacts 9a is disposed at each corner of a pad 3c and contacts 9b are disposed along diagonal lines extending from the center of the pad 3c to the corners. As a further alternative, a group of contacts 9a is disposed only at each corner of a pad 3d while a group of contacts 9b is disposed only at the center of the pad 3d as shown in FIG. 5(d).

Figure 6A:
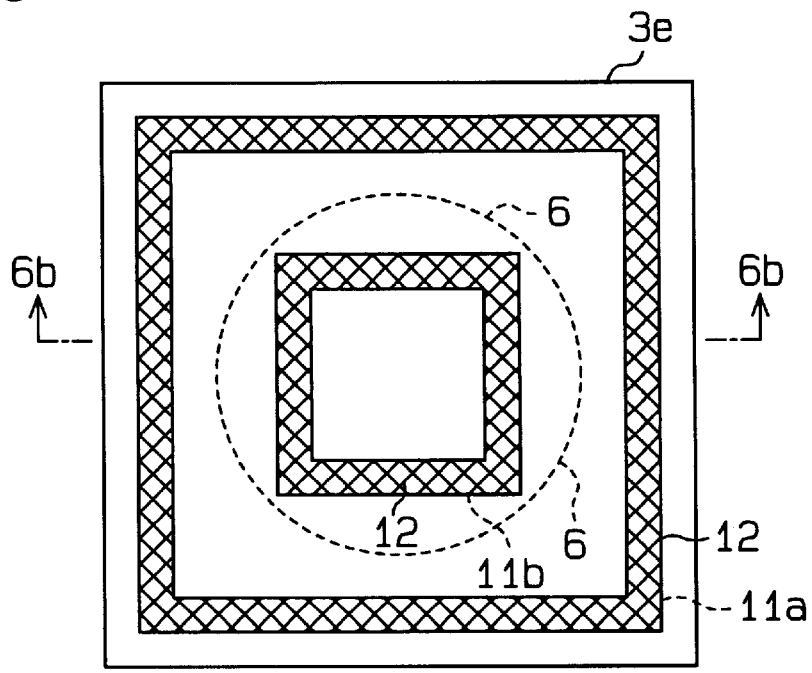
FIG. 6(a) is a top plan view of a yet another pad in accordance with the present invention.
Figure 6B:
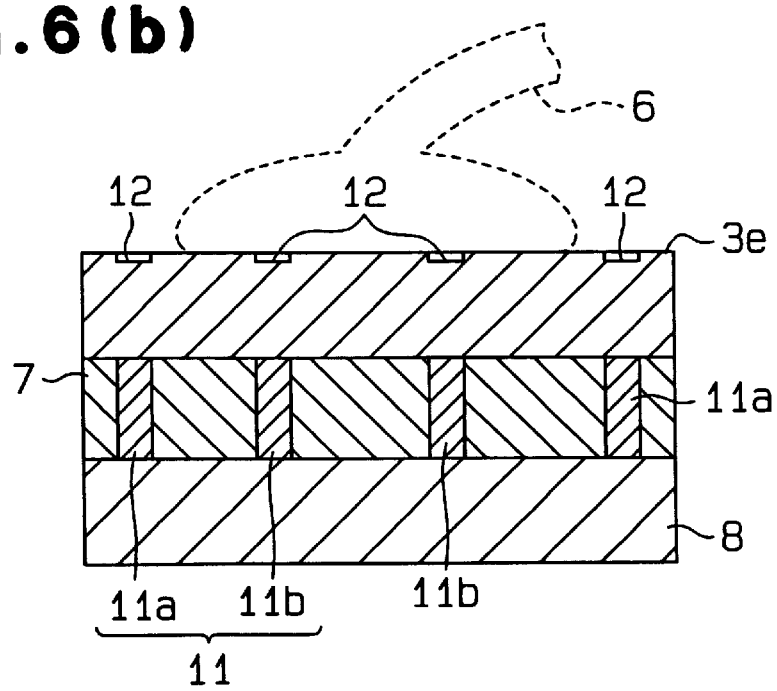
FIG. 6(b) is a cross-sectional view taken along line 6b—6b shown in FIG. 6(a).

As shown in FIG. 6, continuous contacts 11a and 11b may be used. The contact 11a is in the form of a rectangle less in size than the outer profile of a pad 3e. The contact 11b is also in the form of a rectangular disposed within a region designated for bonding with the wire 6 and in concentric relationship with the contact 11a. In this instance, the pad 3e is formed with grooves 12 therein which correspond to the contacts 11a and 11b.

The present examples and embodiments are to be considered as illustrative and not restrictive and the invention is not to be limited to the details given herein, but may be modified within the scope and equivalence of the appended claims.

What is claimed is:

1. A semiconductor device comprising:

a semiconductor chip;

a wiring formed on the semiconductor chip;

an interlayer film disposed on top of the wiring;

a pad disposed on top of the interlayer film and including an outer edge and a central region; and a plurality of contacts formed within the interlayer film to interconnect the pad with the wiring, the plurality of contacts including first and second contact groups which are disposed in an offset manner so as to be locally concentrated along the outer edge and in the central region, respectively, of the pad.

2. The semiconductor device according to claim 1, further comprising a wire bonded to the central region of the pad.

3. The semiconductor device according to claim 2, wherein the contacts of the first contact group are disposed at equal intervals around the outer edge of the pad.

4. The semiconductor device according to claim 3, wherein the contacts of the second contact group are disposed in the central region of the pad so as to radially extend from a center thereof.

5. The semiconductor device according to claim 3, wherein the contacts of the second contact group are disposed at an equal spacing and form a frame configuration.

6. The semiconductor device according to claim 2, wherein the pad is substantially rectangular and the contacts of the first contact group are disposed at at least the four corners of the pad.

7. The semiconductor device according to claim 6, wherein the contacts of the second contact group are disposed so as to radially extend from the center of the pad.

8. The semiconductor device according to claim 6, wherein the contacts of the second contact group are substantially disposed only at central positions within the pad.

9. The semiconductor device according to claim 2, wherein the number of contacts in the second contact group assures a given bonding strength between the pad and the wiring.

10. The semiconductor device according to claim 2, wherein the number of contacts in the second contact group assures a given bonding strength between the pad and the wire.

11. The semiconductor device according to claim 2, wherein the number of contacts in the second contact group is chosen in accordance with an area designated for bonding between the pad and the wire.

12. A semiconductor device comprising:

a semiconductor chip;

a wiring formed on the semiconductor chip;

an interlayer film disposed on top of the wiring;

a pad disposed on top of the interlayer film and including an outer edge and a central region; and first and second contacts formed within the interlayer film for interconnecting the wiring with the pad, the first contact being disposed along the outer edge of the pad and the second contact being disposed in the central region of the pad.

13. The semiconductor device according to claim 12 further comprising a wire bonded to the central region of the pad.

14. The semiconductor device according to claim 11, wherein the first contact forms a closed loop.

15. The semiconductor device according to claim 11, wherein the first contact comprises a plurality of contacts.

16. The semiconductor device according to claim 11, wherein the second contact comprises a plurality of contacts.

* * * * *